(12) United States Patent
Kumamaru

(10) Patent No.: US 7,733,690 B2
(45) Date of Patent: Jun. 8, 2010

(54) SEMICONDUCTOR INTEGRATED CIRCUIT HAVING A LATCH CIRCUIT

(75) Inventor: Tomoyuki Kumamaru, Osaka (JP)

(73) Assignee: Panasonic Corporation, Osaka (JP)

( * ) Notice: Subject to any disclaimer, the term of this patent is extended or adjusted under 35 U.S.C. 154(b) by 380 days.

(21) Appl. No.: 11/878,031

(22) Filed: Jul. 20, 2007

(65) Prior Publication Data
US 2008/0025075 A1 Jan. 31, 2008

(30) Foreign Application Priority Data
Jul. 28, 2006 (JP) ............................. 2006-206204

(51) Int. Cl.
*G11C 11/00* (2006.01)
(52) U.S. Cl. .................. 365/156; 365/154; 365/189.05; 365/226; 365/227; 365/228; 365/229
(58) Field of Classification Search ................ 365/154, 365/156, 189.05, 226, 227, 228, 229
See application file for complete search history.

(56) References Cited
U.S. PATENT DOCUMENTS

| | | | | |
|---|---|---|---|---|
| 5,349,669 | A * | 9/1994 | Arai et al. .................. | 365/228 |
| 5,600,599 | A * | 2/1997 | Nakayama et al. ..... | 365/189.15 |
| 6,566,927 | B2 * | 5/2003 | Park et al. .................... | 327/211 |
| 6,597,620 | B1 | 7/2003 | McMinn | |
| 7,187,205 | B2 * | 3/2007 | Ramaraju et al. ............. | 326/81 |
| 7,346,820 | B2 * | 3/2008 | Padhye et al. ................ | 714/726 |
| 2003/0188241 | A1 | 10/2003 | Zyuban et al. | |
| 2005/0128789 | A1 * | 6/2005 | Houston ..................... | 365/154 |

OTHER PUBLICATIONS

Sakurai, T., et al., "Low-power High-speed LSI Circuits & Technology", Realize Advanced Technology Limited, ISBN4-89808-004-9, 1998, pp. 64-68.

* cited by examiner

*Primary Examiner*—Anh Phung
*Assistant Examiner*—Eric Wendler
(74) *Attorney, Agent, or Firm*—McDermott Will & Emery LLP

(57) ABSTRACT

A semiconductor integrated circuit comprising a data holding circuit sets the data holding circuit to a desired data state by first setting the power-supply voltage of the data holding circuit to be less than a specified voltage, and then setting the power-supply voltage of the data holding circuit to the specified voltage or greater, regardless of the data state that is stored beforehand in the data holding circuit.

24 Claims, 13 Drawing Sheets

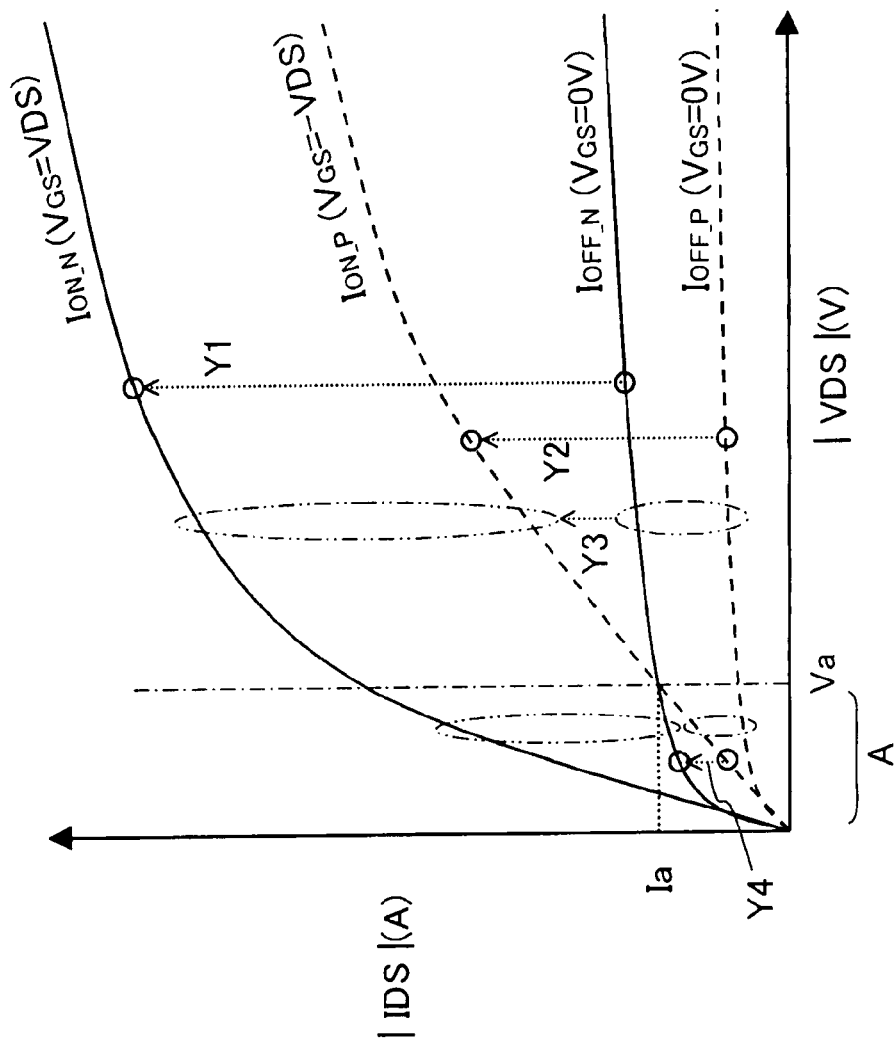
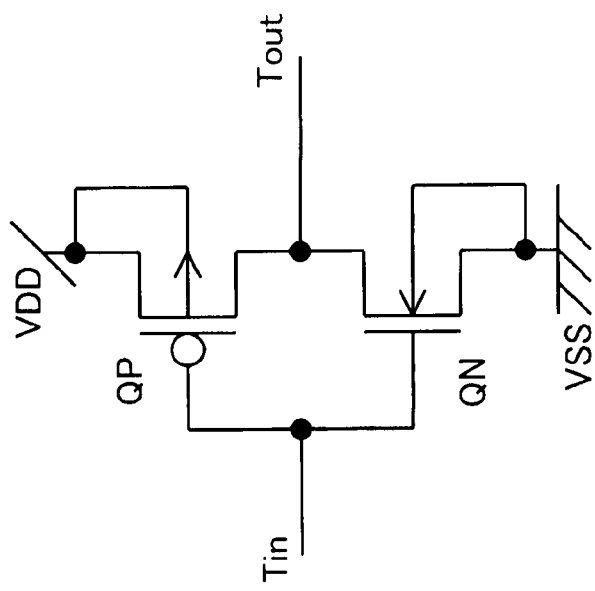
FIG. 1B
FIG. 1A

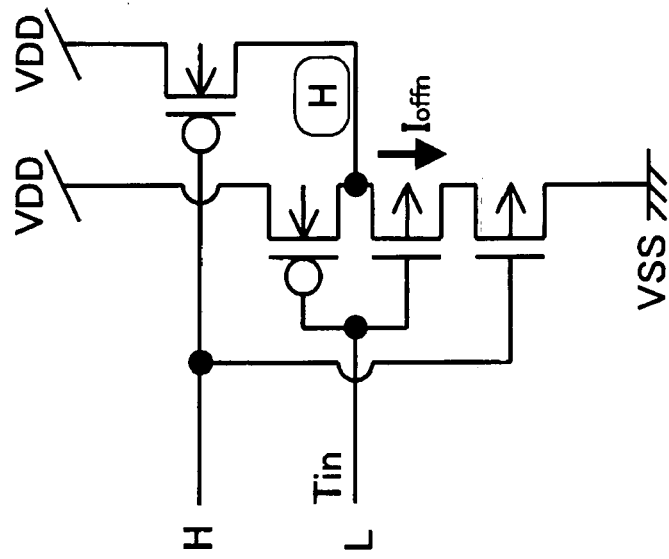
F I G. 5 B
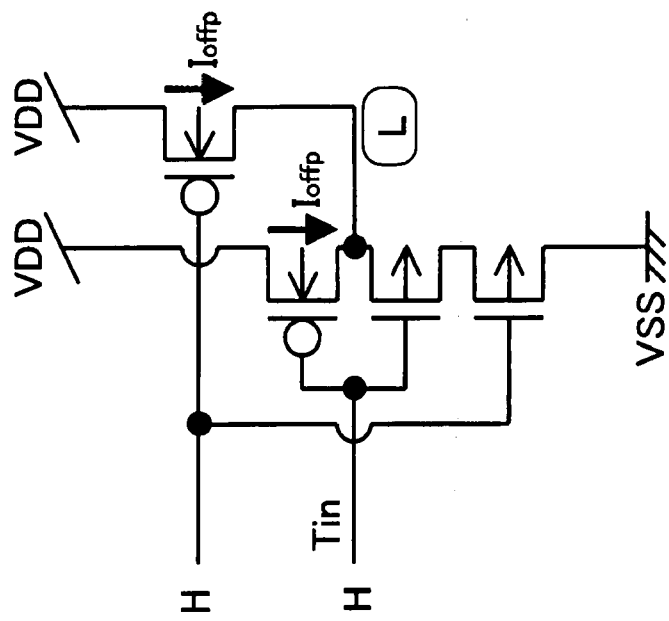
F I G. 5 A

F I G. 7
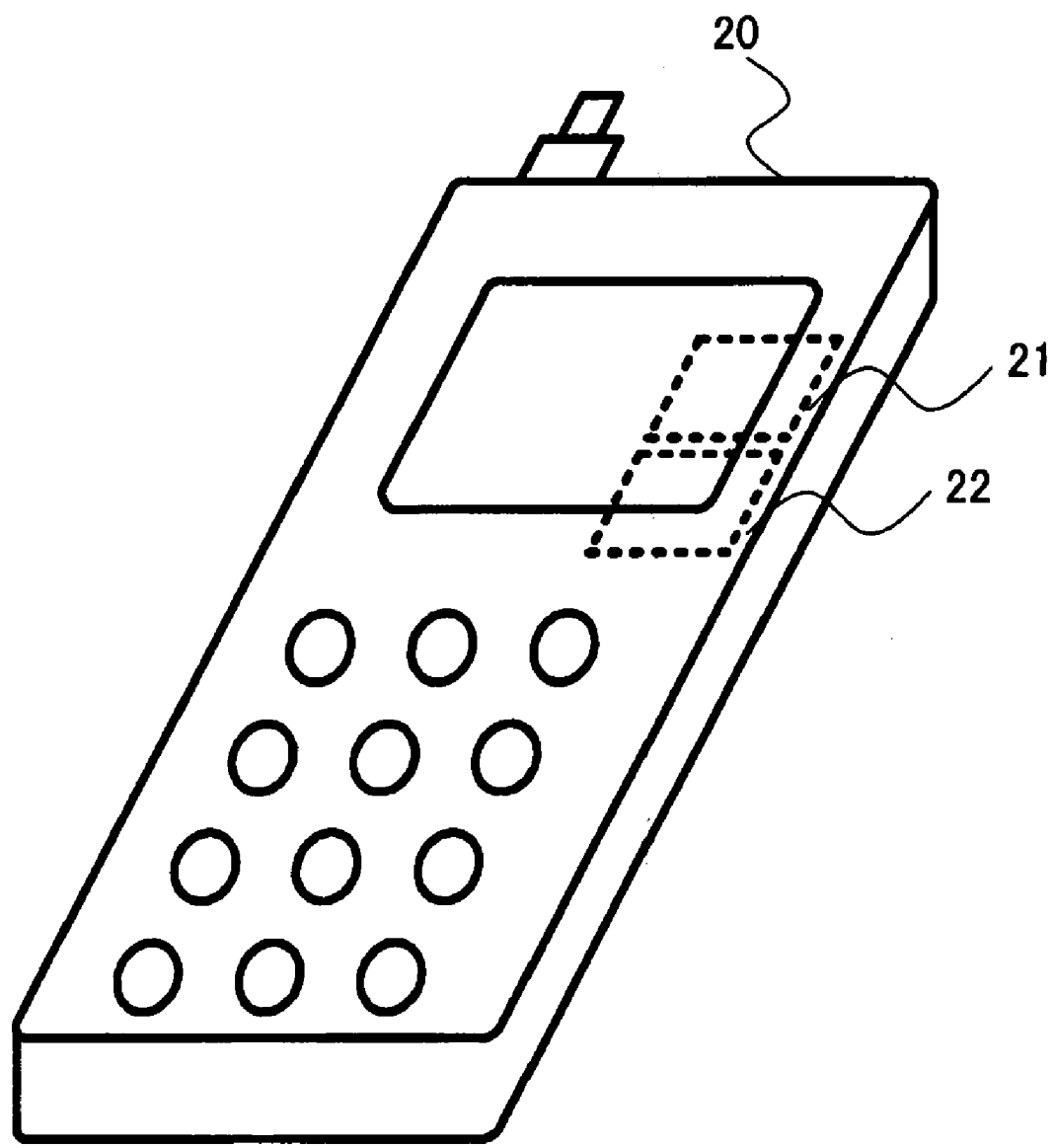

F I G. 9
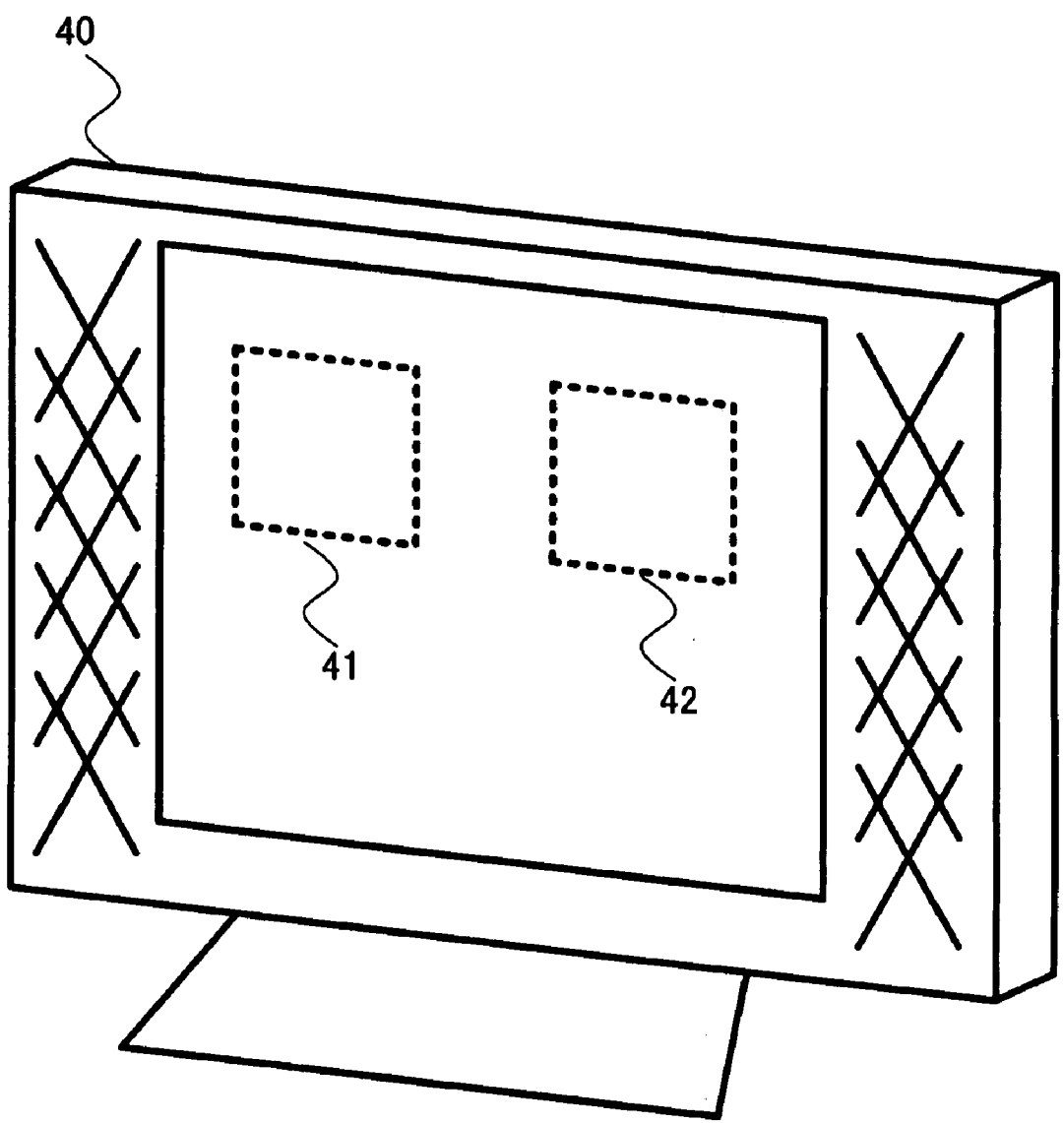

F I G. 1 1
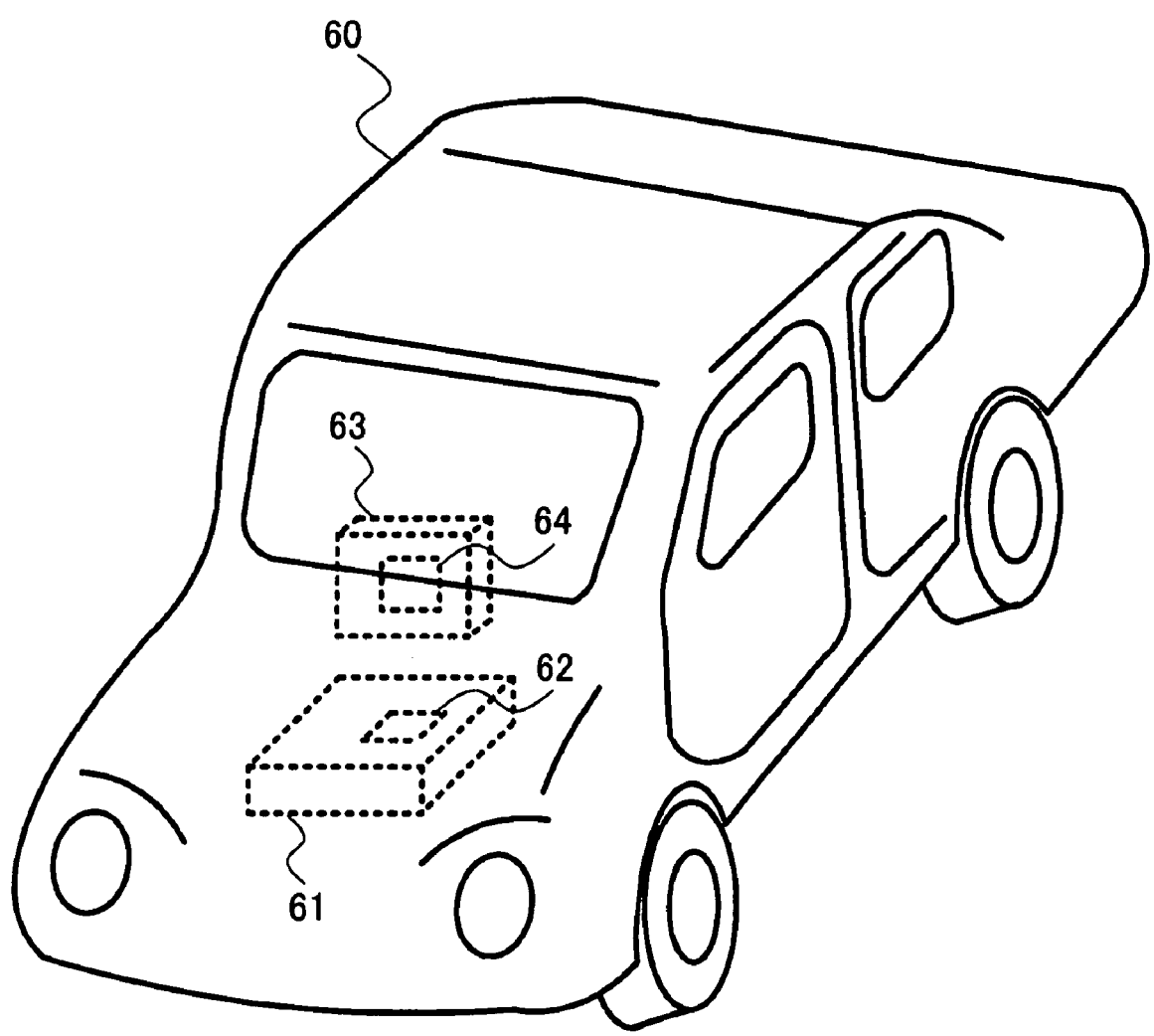

SEMICONDUCTOR INTEGRATED CIRCUIT HAVING A LATCH CIRCUIT

BACKGROUND OF THE INVENTION

1. Field of the Invention

The present invention relates to a semiconductor integrated circuit having a data holding circuit such as a latch, flip flop, and SRAM and related technologies.

2. Description of the Related Art

In a mobile phone terminal, its idle state occupies most in its process flow. Therefore, in a semiconductor integrated circuit for a mobile phone terminal, reducing the leak current in the idle state is an effective measure for lowering the power consumption. Many techniques, such as power-supply control, substrate control and power cut-off have been proposed as techniques for reducing the leak current. Of these, the power cut-off technique is a technique of stopping unnecessary supply of power to circuits during the idle state of the semiconductor integrated circuit, and has a large effect on lowering leakage. However, when processing of stopping the power supply is performed, data held in the data holding circuit of the circuit disappears. Therefore, when it is necessary to save data recorded before the idle state, complicated circuitry and control operation such as for storing data in another circuit are needed; however, in this case, an additional area for storing data temporarily is required and power is consumed during processing of storing data temporarily and restoring the data. This technique is disclosed for example in literature (Takayasu Sakurai, et al., "Low-power, High-speed LSI Technology", Realize Advanced Technology Limited, pp 64-68, 1998).

Also, even in the case of a circuit in which it is not necessary to save data recorded before the idle state, when shifting from an idle state to an operating state, it is necessary to reset data inside the circuit to a specified state, and not only does this operation require processing time, but also consumes power.

The power cut-off technique is effective in this way in reducing power consumption during the idle state of a semiconductor integrated circuit, however, data that is recorded in the internal data-holding circuit cannot be saved. The outline of this power cut-off technique is shown in FIG. 12A and FIG. 12B, taking a latch circuit as an example.

In FIG. 12A, QN1 is a first NMOS transistor, QP1 is a first PMOS transistor, QN2 is a second NMOS transistor, QP2 is a second PMOS transistor, n1 and n2 are latch nodes, VDD is a power-supply terminal, VSS is a ground terminal, and QS is a power-supply switch.

In a normal idle state, "H" or "L" data is recorded in each of the latch nodes n1, n2. In this state, a certain amount of leak current flows in the latch nodes n1, n2. When the power-supply switch QS goes OFF to cut off the power supply, the leak current that flows through the internal transistors becomes essentially zero, and power consumption by the latch circuit is reduced. However, the "H" or "L" data that is recorded by the latch nodes n1, n2 disappears. When the power-supply switch goes ON and the circuit is once again in the power-supply state, the data at the latch nodes n1, n2 differs from the desired data, and each time this operation is repeated the data randomly becomes "H" or "L".

In order to explain this phenomenon, the construction of a normal CMOS inverter is shown in FIG. 13A. In FIG. 13A Tin is an input terminal and Tout is an output terminal. In this CMOS inverter circuit, the output state "H" or "L" is determined according to the magnitude relationship between the ON current and OFF current of the NMOS transistor and PMOS transistor constituting the inverter.

FIG. 13B shows the current characteristics of the NMOS transistor QN and PMOS transistor QP. The characteristic curve of the NMOS transistor QN is shown by the solid line, and the characteristic curve of the PMOS transistor QP is shown by the dashed line. As shown by the arrow Y1, in the NMOS transistor QN, the ON current $I_{ON\_N}$ is always greater than the OFF current $I_{OFF\_N}$, and as shown by the arrow Y2, in the PMOS transistor QP, the ON current $I_{ON\_P}$ is always greater than the OFF current $I_{OFF\_P}$. Therefore, the potential of the output terminal Tout is fixed to the source voltage of the transistor in the ON state that is set according to the input signal. Also, as shown by the arrow Y3, over the entire range of the power-supply voltage VDS, the ON current $I_{ON\_N}$, $I_{ON\_P}$ is greater than the OFF current $I_{OFF\_N}$, $I_{OFF\_P}$. However, when the power-supply voltage is near 0V, the ON current and OFF current of the NMOS transistor QN and PMOS transistor QP become nearly equal, so in this area, the output terminal of the inverter becomes unstable.

As explained above, when the power supply to a latch circuit is cut off, data is lost, so the power cut-off technique cannot be used for circuits in which data must be saved. Also, even in the case of circuits in which data does not need to be saved, data reset operation is necessary for setting the initial state, which is disadvantageous from the aspect of time and power consumption.

SUMMARY OF THE INVENTION

The present invention includes a data holding circuit that is capable of storing information, and regardless of a data state that is stored beforehand in the data holding circuit, sets the data holding circuit to a desired data state by first setting the power-supply voltage of the data holding circuit to be less than a specified voltage, and then setting the power-supply voltage of the data holding circuit to the specified voltage or greater.

For example, the invention is constructed so that by setting the power-supply voltage to a specified voltage or greater after once setting the power-supply voltage to be less than that specified voltage, "L" level is always obtained at the output terminal, or is constructed so that by setting the power-supply voltage to a specified voltage or greater after once setting the power-supply voltage to be less than that specified voltage, "H" level is always obtained at the output terminal.

More specifically, the present invention is constructed as described below. The invention comprises a latch circuit; wherein the latch circuit comprises a first inverter and a second inverter that are both constructed from CMOS transistors;

the first inverter comprises a first NMOS transistor and a first PMOS transistor;

the second inverter comprises a second NMOS transistor and a second PMOS transistor;

the current capability of the first NMOS transistor is greater than the current capability of the first PMOS transistor when the power-supply voltage becomes less than a specified voltage; and the current capability of the second PMOS transistor is greater than the current capability of the second NMOS transistor when the power-supply voltage becomes less than the specified voltage.

In this case, by setting the power-supply voltage to a specified voltage or greater after once setting the power-supply voltage to be less than that specified voltage, "H" level is always obtained at the output terminal of the latch circuit.

Also, the invention comprises a latch circuit; wherein
the latch circuit comprises a first inverter and a second inverter that are both constructed from CMOS transistors;
the first inverter comprises a first NMOS transistor and a first PMOS transistor;
the second inverter comprises a second NMOS transistor and a second PMOS transistor;
the current capability of the first PMOS transistor is greater than the current capability of the first NMOS transistor when the power-supply voltage becomes less than a specified voltage; and
the current capability of the second NMOS transistor is greater than the current capability of the second PNOS transistor when the power-supply voltage becomes less than the specified voltage.

In this case, by setting the power-supply voltage to a specified voltage or greater after once setting the power-supply voltage to be less than that specified voltage, "L" level is always obtained at the output terminal of the latch circuit. In order to set this kind of magnitude relationship between current capabilities, the gate width, gate length, gate oxide layer thickness or threshold voltage of the NMOS transistors or PMOS transistors is adjusted.

As described above, with the present invention, by setting the power-supply voltage to be less than a specified voltage, and then setting the power-supply voltage to be that specified voltage or greater, specific nodes in a semiconductor integrated circuit are set to a desired data state. As a result, operation for a return from a reduced power-supply state aimed at reduction in leak current or from a power cut-off state can be performed at high speed. Also, the scale of circuitry required to do this is small, so there is little increase in size, there is no need to add complicated processing operations for setting data to an arbitrary state, and there is no increase in power consumption that occurs due to those operations.

Another form of the invention further comprises a current source that supplies a specified current to data holding nodes. In this case, it is preferred that the current source be constructed from a resistance element or MOS transistor.

In this construction as well, as described above, by setting the power-supply voltage to a specified voltage or greater after once setting the power-supply voltage to be less than that specified voltage, "H" level or "L" level is always obtained at the output terminal of the latch circuit. Also, in the construction described above, by making the power-supply voltage of the semiconductor integrated circuit less than a specified voltage, the data state of the semiconductor integrated circuit can be intentionally set so that the leak current becomes small when the circuit is idle.

With the present invention, by setting the power-supply voltage to be less than a specified voltage, and then setting the power-supply voltage to the specified voltage or greater, specific nodes in a semiconductor integrated circuit can be set to a desired data state. As a result, operation for a return from a reduced power-supply state aimed at reduction in leak current or from a power cut-off state can be performed at high speed. Also, the scale of circuitry required to do this is small, so there is little increase in size, there is no need to add complicated processing operations for setting data to an arbitrary state, and there is no increase in power consumption that occurs due to those operations.

Moreover, by applying the present invention, nodes in a semiconductor integrated circuit can be set to a state with little leak current, and the present invention is even more effective in reducing the power consumption of the semiconductor integrated circuit.

In this way, with the present invention, a semiconductor integrated circuit including a data holding circuit that does not need to save data recorded before power cut-off when power is cut off but needs to set a node to a specific data state is realized without an increase in power and size and without additional complicated operation. Moreover, by setting the internal nodes of a semiconductor integrated circuit to a specified data state, the leak current flowing in the semiconductor integrated circuit is reduced.

Since the present invention is capable of easily causing a node in a semiconductor to be restored to an arbitrary data state by itself by setting the power-supply voltage to be less than a specified voltage, various applications can be expected. The invention shortens the time required for the return to a the operating state from a power cut-off state of a semiconductor integrated circuit, with little disadvantages in size and power. Furthermore, by applying the invention, leak current during the idle state of a semiconductor integrated circuit can be reduced. Taking this into consideration, many applications are feasible.

BRIEF DESCRIPTION OF THE DRAWINGS

The other objects of the present invention will become clear by understanding the described embodiments, and will be clearly stated in the claims. By embodying the present invention, the many advantages of the invention that were not touched upon in this specification will become obvious to those skilled in the art.

FIG. 1A is a circuit diagram showing the principle of the present invention;

FIG. 1B is a current characteristics diagram showing the principle of the present invention;

FIGS. 5A and 5B are circuit diagrams that show the input signal reliance of the leak current in a logic circuit of a fourth embodiment of the invention;

FIG. 7 is a pictorial drawing of a communication apparatus that comprises a semiconductor integrated circuit of the invention;

FIG. 9 is a pictorial drawing of an image display apparatus that comprises a semiconductor integrated circuit of the invention;

FIG. 11 is a pictorial drawing of an electronic control apparatus that comprise a semiconductor integrated circuit of the invention, and an apparatus having a movement function that comprises that electronic control apparatus;

DETAILED DESCRIPTION OF THE INVENTION

Preferred embodiments of the present invention are explained with reference to the supplied drawings. First, a summary of the technical principles of the invention is given.

(Explanation of Principles)

FIG. 1A shows a basic inverter circuit of an embodiment of the present invention, where QN is a NMOS transistor, QP is a PMOS transistor, Tin is an input terminal of the inverter circuit, Tout is an output terminal, VDD is a power-supply terminal and VSS is a ground terminal. A feature of this inverter circuit is the electric current capabilities of the NMOS transistor QN and PMOS transistor QP.

Figure 13B:
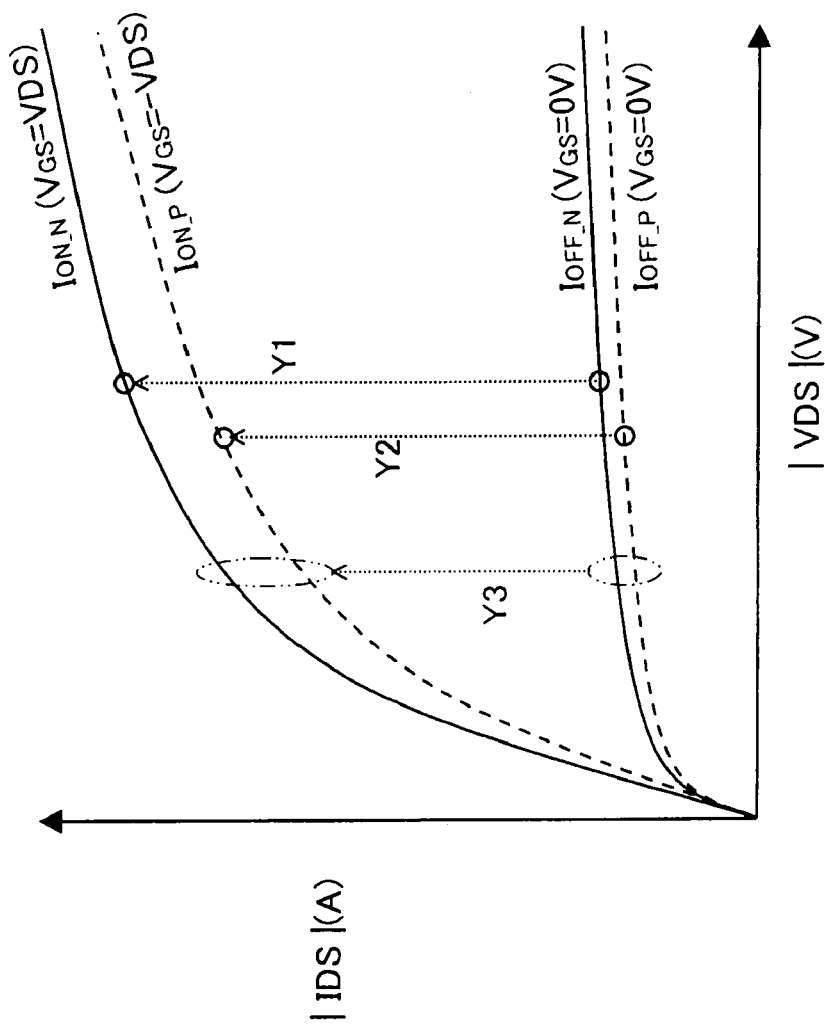
FIG. 13B is a current characteristics diagram of related art.
Figure 13A:
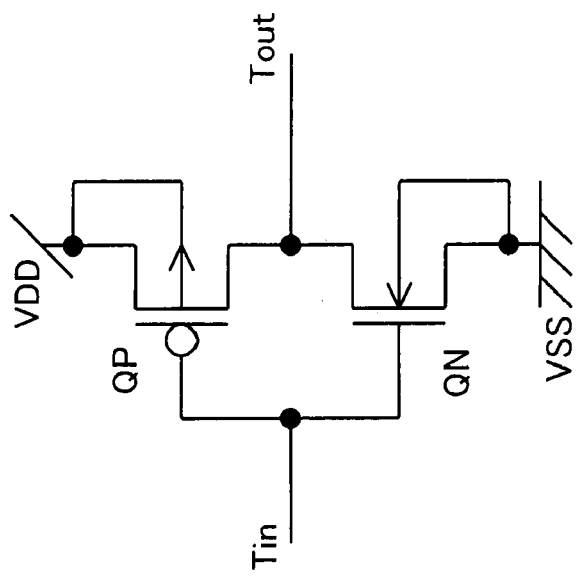
FIG. 13A is a circuit diagram showing the principle of related art.

FIG. 1B shows the current characteristics of the NMOS transistor QN and PMOS transistor QP. A volt-ampere curve for the NMOS transistor QN is shown by the solid line, and a volt-ampere curve for the PMOS transistor QP is shown by the dashed line. In comparison with the related art shown in FIG. 13A and FIG. 13B, the volt-ampere curves for the PMOS transistor QP shown by the dashed line have greatly dropped. As shown by the arrow Y1, in the NMOS transistor QN, the ON current $I_{ON\_N}$ is always greater than the OFF current $I_{OFF\_N}$, and as shown by the arrow Y2, in the PMOS transistor QP, the ON current $I_{ON\_P}$ is always greater than the OFF current $I_{OFF\_P}$. Also, as shown by the arrow Y3, in the voltage range where the power-supply voltage VDS is an arbitrarily specified voltage Va or greater, the ON currents $I_{ON\_N}$, $I_{ON\_P}$ are greater than the OFF currents $I_{OFF\_N}$, $I_{OFF\_P}$.

However, as mentioned, the ON current $I_{ON\_P}$ of the PMOS transistor QP has dropped, so the volt-ampere curve of this ON current $I_{ON\_P}$ crosses the volt-ampere curve of the OFF current $I_{OFF\_N}$ of the NMOS transistor QN. The crossing point is at the power-supply voltage Va. Therefore, as shown by the arrow Y4, when the power-supply voltage becomes less than the specified voltage Va, the OFF current $I_{OFF\_N}$ of the NMOS transistor QN becomes greater than the ON current $I_{ON\_P}$ of the PMOS transistor QP. In other words, the magnitude relationship between the ON current $I_{ON\_P}$ of the PMOS transistor QP and the OFF current $I_{OFF\_N}$ of the NMOS transistor QN becomes reversed at the specified voltage Va. As a result, in the area A where VDS<Va, the current capability of the NMOS transistor QN becomes greater than the current capability of the PMOS transistor QP, regardless of whether the current is an ON or OFF current.

Normally, the signal state of the output during the operation of an inverter circuit is determined according to the relationship between the current capability of the NMOS transistor and PMOS transistor that make up the inverter. That is, the ON current of the NMOS transistor and PMOS transistor is always greater than the OFF current, so a signal that is inverted with respect to an input signal is output.

On the other hand, as shown in FIG. 1B, in the case of the inverter circuit of this embodiment, the current capability of the NMOS transistor QN is greater than that of the PMOS transistor QP in the area A where VDS<Va. Therefore, the level of the output at the output terminal Tout is always "L" in area A regardless of the signal level at the input terminal Tin. Thus, when the power-supply voltage is set to be a specified voltage Va or greater after once being set to be less than that specified voltage Va, the level of the output at the output terminal Tout will always be "L".

In order to make the current characteristics of the inverter circuit be like those shown in FIG. 1B, the threshold voltage, W size, L size, gate oxide film thickness of the NMOS transistor QN and PMOS transistor QP can be adjusted. The W size is the gate width of the MOS transistor, and the L size is the gate length.

FIG. 1A and FIG. 1B show that in the area A where VDS<Va, the current capability of the NMOS transistor QN is greater than that of the PMOS transistor QP; however, conversely, in the area A where VDS<Va, the current capability of the PMOS transistor QP can be made to be greater than that of the NMOS transistor QN regardless of the ON and OFF currents. In that case, by setting the power-supply voltage to be a specified voltage Va or greater after once being set to be less than that specified voltage Va, the level of the output at the output terminal Tout will always be "H".

Preferred embodiments of the present invention will be explained with reference to the supplied drawings.

Embodiment 1

Figure 2B:
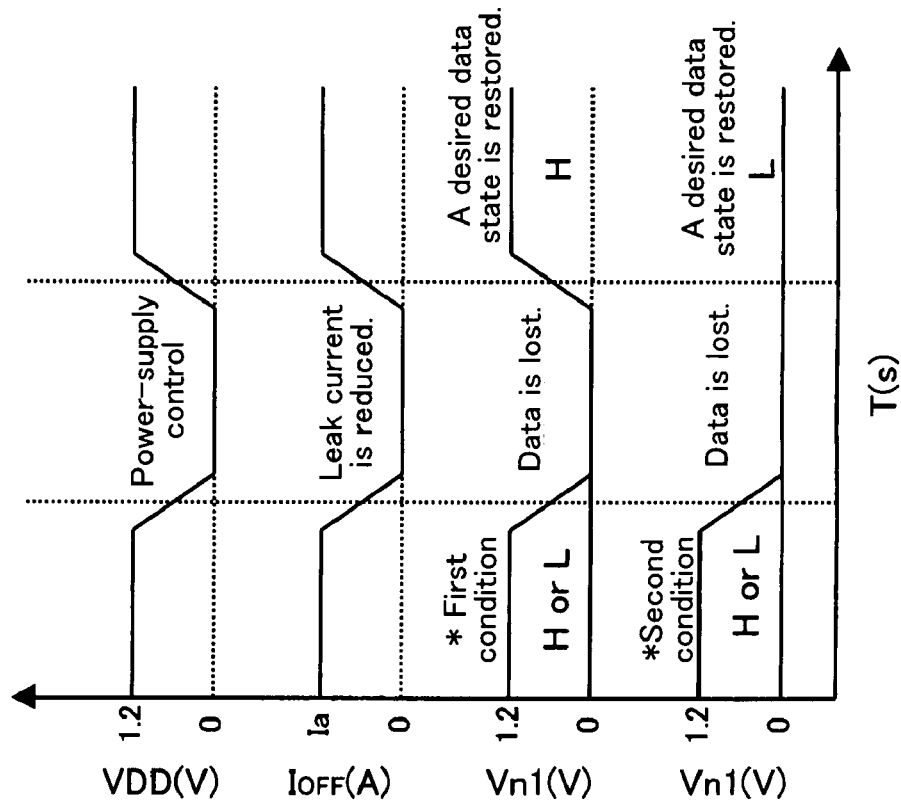
FIG. 2B is a drawing explaining the operation for setting the power-supply voltage of the semiconductor integrated circuit of the first embodiment of the invention to less than a specified voltage.
Figure 2A:
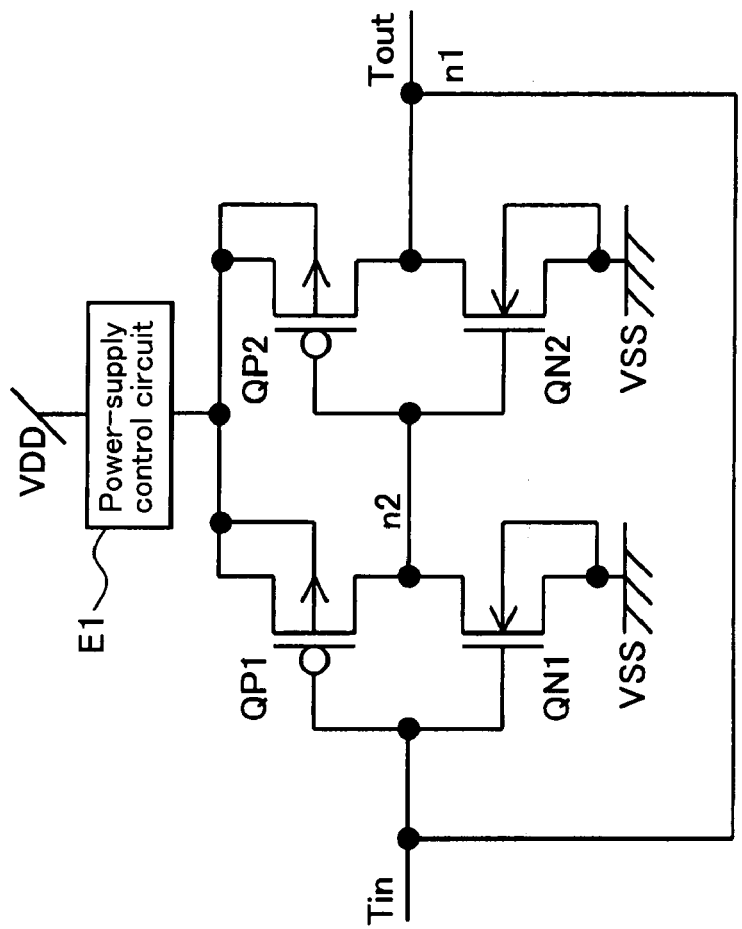
FIG. 2A is a circuit diagram of a semiconductor integrated circuit of a first embodiment of the invention.

FIG. 2A and FIG. 2B show a semiconductor integrated circuit of a first embodiment of the invention. In FIG. 2A, QN1 is a first NMOS transistor, QP1 is a first PMOS transistor, QN2 is a second NMOS transistor, QP2 is a second PMOS transistor, and E1 is a power-supply control circuit.

The current capabilities of the first NMOS transistor QN1 and first PMOS transistor QP1 are set so that the current capability of one of the transistors becomes large when the power-supply voltage becomes less than an arbitrarily specified voltage Va, regardless of the ON or OFF state.

The current capabilities of the second NMOS transistor QN2 and second PMOS transistor QP2 are set so that the current capability of one of the transistors becomes large when the power-supply voltage becomes less than an arbitrarily specified voltage Va, regardless of the ON or OFF state. Provided, however, the magnitude relationship is such that there is an inverse relationship between the former and latter.

FIG. 2B shows the operation for the case in which the power-supply voltage of a latch circuit of this embodiment is set to be a specified voltage Va or greater after having been set once to be less than that specified voltage Va. A first condition is set such that when the power-supply voltage is less than the specified voltage Va, the current capability of the first NMOS transistor QN1 is always greater than that of the first PMOS transistor QP1, and the current capability of the second PMOS transistor QP2 is always greater than that of the second NMOS transistor QN2, regardless of the ON state and OFF state of each transistor.

A second condition is set such that when the power-supply voltage is less than the specified voltage Va, the current capability of the first PMOS transistor QP1 is always greater than that of the first NMOS transistor QN1, and the current capability of the second NMOS transistor QN2 is always greater than that of the second PMOS transistor QP2, regardless of the ON state and OFF state of each transistor.

In the normal idle state before the power-supply voltage is set to be less than the specified voltage Va, the normal power-supply voltage VDD is applied, and leak current $I_{OFF}$ flows in the circuit. At this time, arbitrary data is recorded in the latch circuit. By having the power-supply control circuit E1 set the power-supply voltage to 0V, the leak current stops flowing, and power consumption is reduced. At that time, power-supply voltage is not supplied to the latch nodes, so data cannot be saved.

Therefore, when the state moves to a normal idle state after the power-supply control circuit E1 starts supplying power, in the case of condition 1, the current capabilities of the first NMOS transistor QN1 and second PMOS transistor QP2 are large, so data for the "H" state is always written in latch node n1. On the other hand, in the case of condition 2, the current capabilities of the first PMOS transistor QP1 and the second NMOS transistor QN2 are large, so data for the "L" state is always written in latch node n1. In this way, the latch circuit of this embodiment restores a desired data state even after the power-supply voltage is set once to be less than the specified voltage Va.

With this embodiment, in the case, for example, where it is necessary to read data externally at startup of the LSI, and write that data in an internal memory area, the necessary memory data is set by simply setting the power-supply voltage once to be less than the specified voltage Va. Therefore, it is not necessary to have a special system, operation or power in order to read the data. Moreover, the latch circuit operates like a normal latch during normal operation.

In this embodiment, each of the nodes of the latch circuit is connected to another circuit. Therefore, the current capabilities of the transistors that make up the latch may be determined taking into consideration the leak current component that flows by way of the connections between each of the nodes of the latch circuit and other circuits.

Embodiment 2

Figure 3:
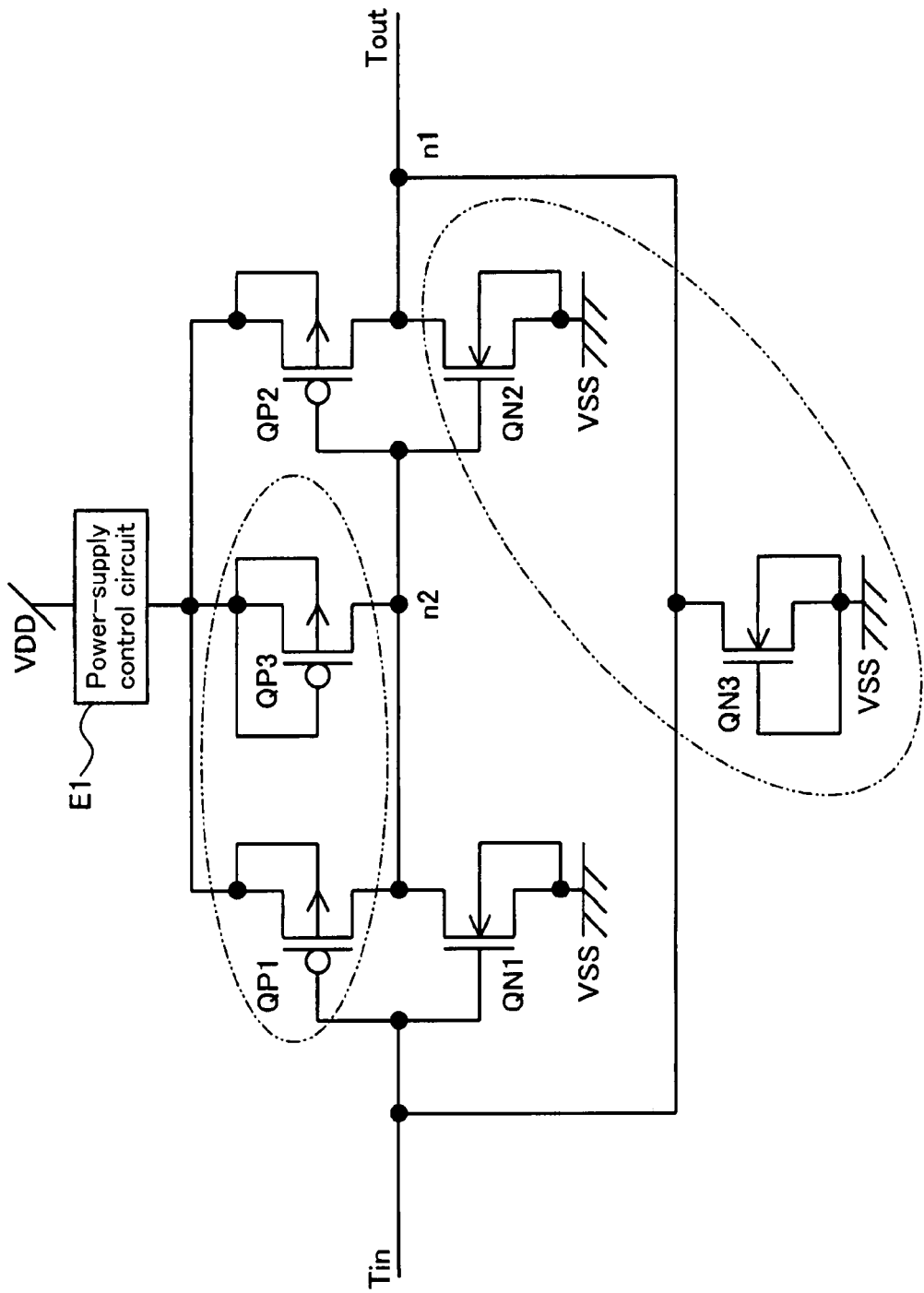
FIG. 3 is a circuit diagram of a semiconductor integrated circuit of a second embodiment of the invention.

FIG. 3 shows a semiconductor integrated circuit of a second embodiment of the invention. In FIG. 3, QN3 is a normally-OFF third NMOS transistor, and QP3 is a normally-OFF third PMOS transistor. Except for the inverter, this latch circuit is characterized by the normally-OFF third NMOS transistor QN3 being located at latch node n1, and the normally-OFF third PMOS transistor QP3 being located at latch node n2. The remaining construction is the same as that of the first embodiment (FIGS. 2A, 2B), so the same reference numbers are given to elements having the same construction, and a detailed explanation of them is omitted.

When the power-supply voltage is set to be less than a specified voltage Va, the characteristics of the third NMOS transistor QN3 and the characteristics of the third PMOS transistor QP3 are set so that the following conditions are satisfied:

The sum of the OFF current of the second NMOS transistor QN2 and the OFF current of the third NMOS transistor QN3 is greater than the ON current of the second PMOS transistor QP2, and The sum of the OFF current of the first PMOS transistor QP1 and the OFF current of the third PMOS transistor QP3 is greater than the ON current of the first NMOS transistor QN1. More specifically, the characteristics of the third NMOS transistor QN3 and the characteristics of the third PMOS transistor QP3 are set so that the following conditions are satisfied:

The current capability from latch node n1 to the ground terminal VSS is greater than the current capability from the power-supply terminal VDD to latch node n1, and The current capability from the power-supply terminal VDD to latch node n2 is greater than the current capability from latch node n2 to the ground terminal VSS.

When the power-supply voltage of the latch circuit is set once to be less than the specified voltage Va, and then the power supply voltage is set again to the specified voltage Va or greater, the latch node n1 is fixed at "L" data, and latch node n2 is fixed at "H" data.

As explained above, in this embodiment, there is a third NMOS transistor QN3 and third PMOS transistor QP3, having the characteristics described above, in the latch circuit, and through the use of these transistors, the latch nodes are set to a desired data state by simply setting the power-supply voltage to a specified voltage Va after once setting it to be less than that specified voltage Va.

Also, as in the first embodiment, in this embodiment, each of the nodes of the latch circuit is connected to another circuit. Therefore, the current capabilities of the transistors that make up the latch may be determined taking into consideration the leak current component that flows by way of the connections between each of the nodes of the latch circuit and other circuits.

Embodiment 3

Figure 4:
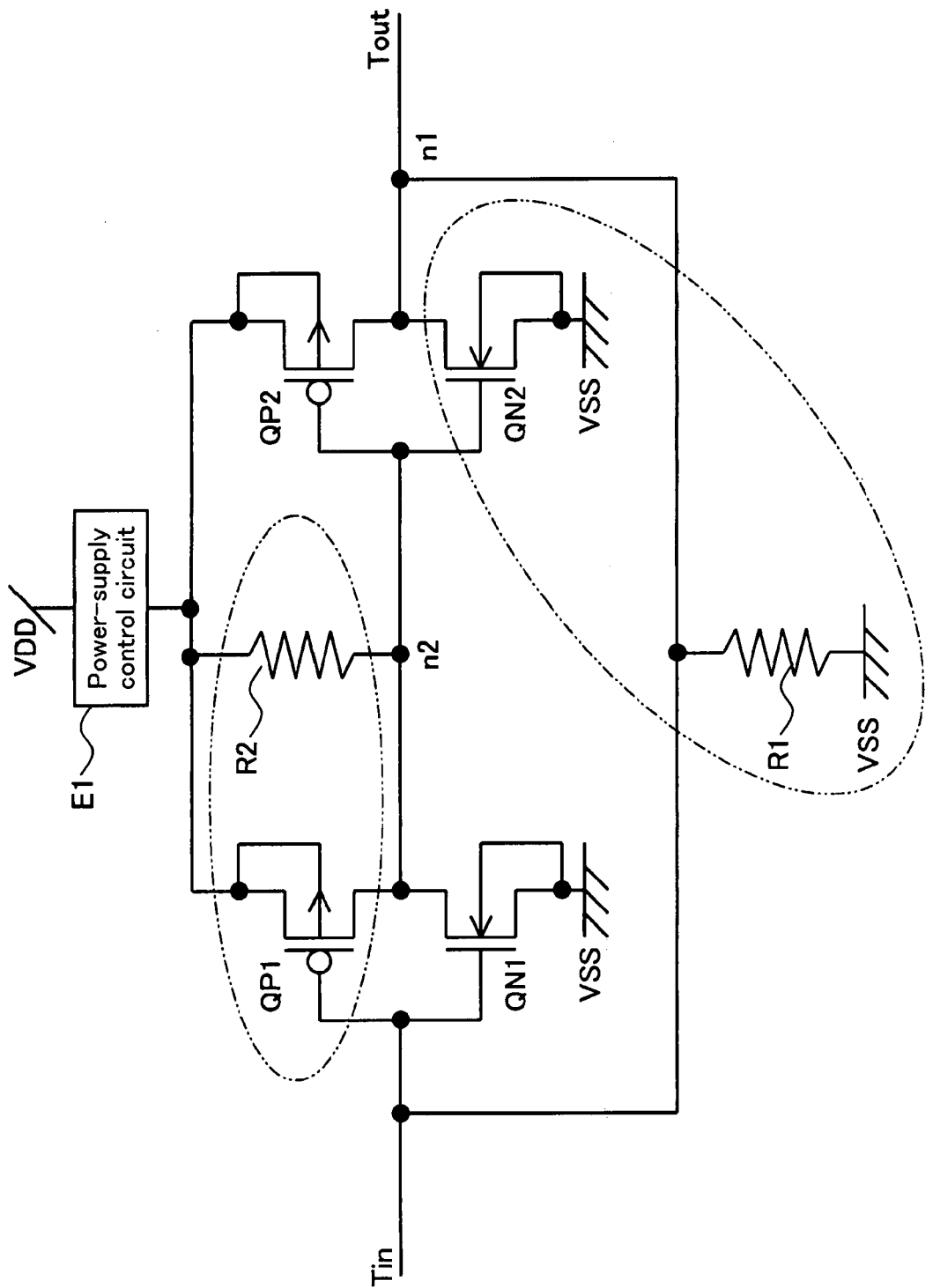
FIG. 4 is a circuit diagram of a semiconductor integrated circuit of a third embodiment of the invention.

FIG. 4 shows a semiconductor integrated circuit of a third embodiment of the invention. In FIG. 4, R1 is a first resistance, and R2 is a second resistance. Except for the inverter, this latch circuit is characterized by the first resistance R1 that is located at latch node n1, and the second resistance R2 that is located at latch node n2. The remaining construction is the same as that of the first embodiment (FIGS. 2A, 2B) so the same reference numbers are given to elements having the same construction, and a detailed explanation of them is omitted.

When the power-supply voltage is set to be less than a specified voltage Va, the values of the first resistance R1 and the second resistance R2 are set so that the following conditions are satisfied:

The sum of the OFF current of the second NMOS transistor QN2 and the current flowing through the first resistance R1 is greater than the ON current of the second PMOS transistor QP2, and The sum of the OFF current of the first PMOS transistor QP1 and the current flowing through the second resistance R2 is greater than the ON current of the first NMOS transistor QN1.

From this, it follows that:

The current capability from latch node n1 to the ground terminal VSS is greater than the current capability from the power-supply terminal VDD to latch node n1, and the current capability from the power-supply terminal VDD to latch node n2 is greater than the current capability from latch node n2 to the ground terminal VSS.

In a latch circuit whose characteristics are set as described above, when the power-supply voltage is once set to be less than the specified voltage Va, and then after that is set to be the specified voltage Va or greater, latch node n1 is fixed at "L" data, and latch node n2 is fixed at "H" data.

By placing a first resistance R1 and second resistance R2, having characteristics that satisfy the conditions described above, in a latch circuit in this way, the latch nodes are set to desired data states by simply setting the power-supply voltage to a specified voltage Va or greater after having once set the power-supply voltage to be less than that specified voltage Va.

Also, as in the first embodiment, in this embodiment, each of the nodes of the latch circuit is connected to another circuit. Therefore, the current capabilities of the transistors that make up the latch may be determined taking into consideration the leak current component that flows by way of the connections between each of the nodes and other circuits.

Embodiment 4

Next, a fourth embodiment of the invention is explained. FIGS. 5A, 5B show the difference in leak current due to the difference in input signals of a 2-input type NAND circuit. In FIGS. 5A, 5B, Tin is one of the input terminals of the 2-input NAND circuit. Here, the other input terminal is presumed to be fixed at VDD.

As shown in FIG. 5A, when the signal at the input terminal Tin is "H", all of the NMOS transistors are in the ON state, and all of the PMOS transistors are in the OFF state. As a result, the two PMOS transistors become a path that allow leak current to flow. On the other hand, as shown in FIG. 5B, when the signal at the input terminal Tin is "L", one of the two NMOS transistors is in the ON state, and the other is in the OFF state. Similarly, one of the two PMOS transistors is in the ON state, and the other is in the OFF state. As a result, one of the NMOS transistors becomes a path that allows the flow of leak current. In a 2-input NAND circuit having this kind of construction, when the threshold voltage, W size, L size and leak current characteristics of the NMOS transistors and PMOS transistors are basically the same, leak current is reduced more in the signal of the input terminal that is "L" than in the signal that is "H". Moreover, multi-level transistors reduce the leak current more than a single-level transistor, so this effect is also obtained. By being able to select the signal state of internal nodes during the idle state of the semiconductor integrated circuit, the leak current of the semiconductor integrated circuit of this embodiment can be reduced.

Figure 6:
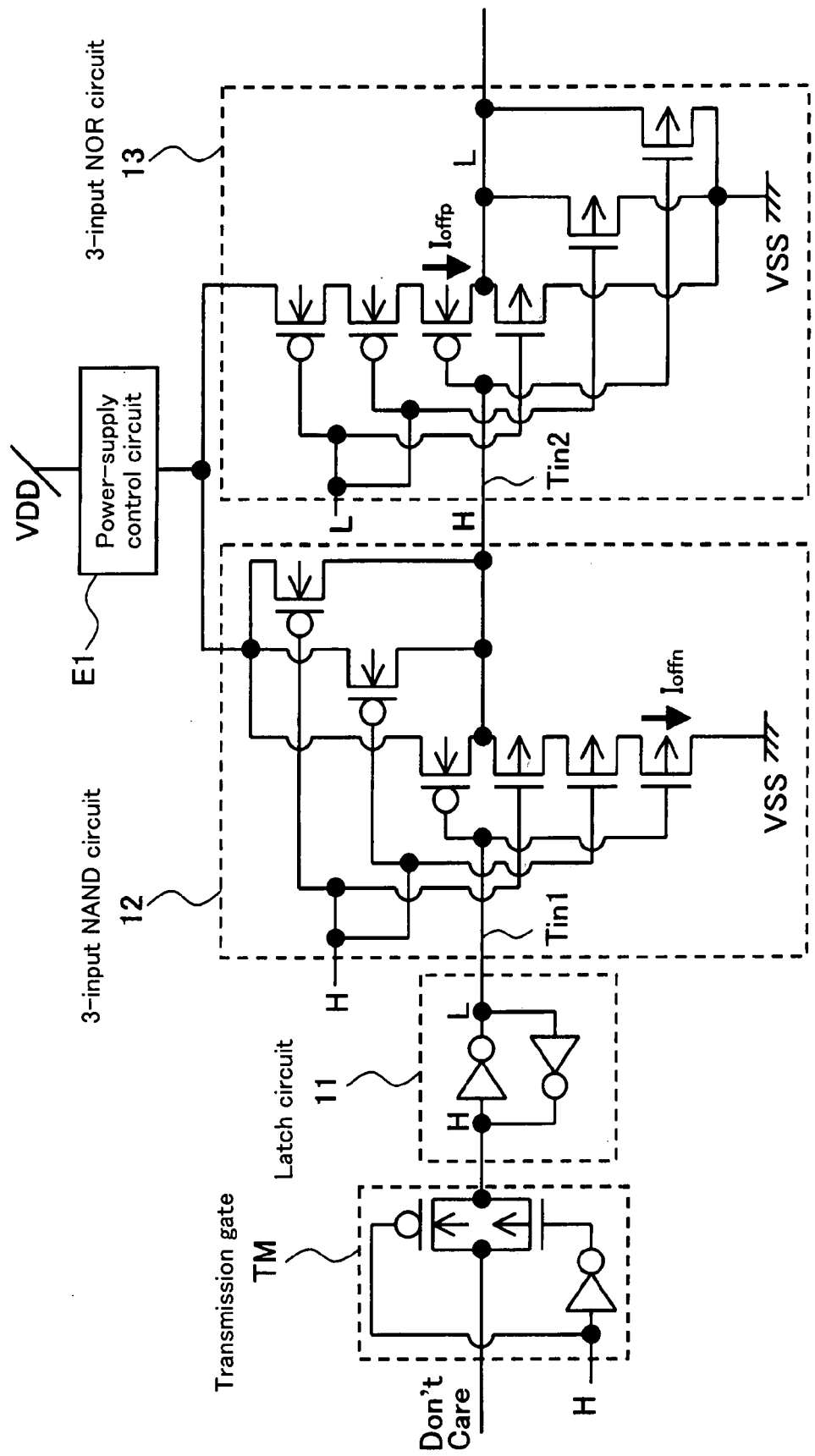
FIG. 6 is a circuit diagram of a semiconductor integrated circuit of the fourth embodiment of the invention.

FIG. 6 shows a semiconductor integrated circuit of this fourth embodiment. In FIG. 6, numeral 11 is a latch circuit, TM is a transmission gate, 12 is a 3-input type NAND circuit, 13 is a 3-input type NOR circuit, Tin1 is the input terminal of the 3-input NAND circuit 12, and Tin2 is the input terminal of the 3-input NOR circuit 13.

It is assumed that the latch circuit 11 is a circuit that sets the potential of node Tin1 to "L" and the potential of node Tn2 to "H" by setting the power-supply voltage to a specified voltage Va or greater after once setting it to be less than that specified voltage Va (FIGS. 5A and 5B). With construction, by intentionally setting the potential of node Tin1 of the 3-input NAND circuit to "L" when idle, the leak current is greatly reduced. The reason for this is as described above using FIGS. 5A and 5B. Also, by intentionally setting the potential of node Tin2 of the 3-input NOR circuit 13 to "H" when idle, the leak current is greatly reduced. When doing this, the transmission gate TM or the like is used in order to maintain the data of the latch circuit 11. As long as the data of the latch circuit 11 is maintained, any switch other than the transmission gate TM could also be used.

In this embodiment, power consumption up until the start of operation is reduced by setting the power-supply voltage to a specified voltage Va or greater after once setting it to be less than that specified voltage Va. Also, the construction is simpler than construction for performing power cut-off of each block, and since the number of power supplies is not increased, there are few demerits from the aspect of increased size.

FIG. 7 is a pictorial drawing of a communication apparatus that comprises a semiconductor integrated circuit of the invention. A mobile phone 20 comprises a baseband LSI 21 and an application LSI 22. The baseband LSI 21 and application LSI 22 are semiconductor integrated circuits that have the construction of the present invention. The semiconductor integrated circuit of this invention operates with less power consumption than a conventional semiconductor integrated circuit, so the baseband LSI 21, application LSI 22 and the mobile phone 20 that comprises these are also capable of low-power operation. Moreover, by constructing the logic circuits of semiconductor integrated circuits of the mobile phone 20 other than the baseband LSI 21 and application LSI 22 according to the present invention, the same effect as described above is obtained.

This kind of communication apparatus is not limited to a mobile phone, and includes, for example, a transmitter or receiver in a communication system, a modem that performs data transmission, etc. By using this kind of construction, the effect of reducing power consumption is obtained for all kinds of communication apparatuses regardless of whether the apparatus is for wired, wireless, optical, or electrical communication, and regardless of whether the apparatus is digital or analog.

Figure 8:
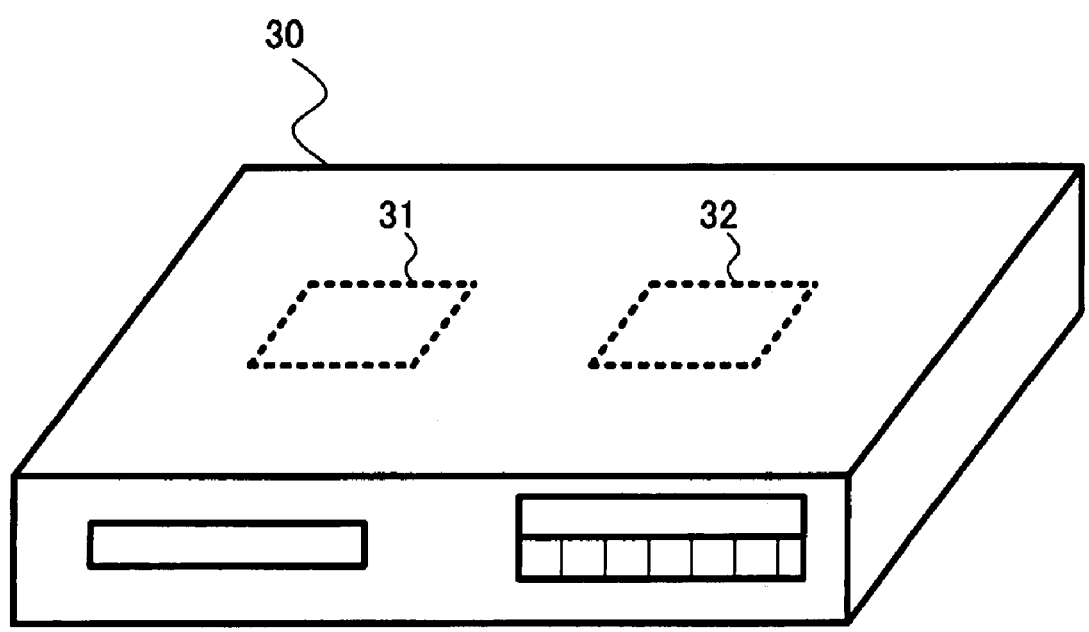
FIG. 8 is a pictorial drawing of an information reproduction apparatus that comprises a semiconductor integrated circuit of the invention.

FIG. 8 is a pictorial drawing of an information reproduction apparatus that comprises a semiconductor integrated circuit of the invention. An optical disc apparatus 30 comprises a media-signal processing LSI 31 that processes a signal that is read from an optical disc, and an error-correction and servo processing LSI 32 that performs error correction of the signal, and performs servo control of an optical pickup. The media-signal processing LSI 31 and error-correction and servo processing LSI 32 are semiconductor integrated circuits that have the construction of the present invention. This semiconductor integrated circuit operates with less power consumption than a conventional semiconductor integrated circuit, so the media-signal processing LSI 31, error-correction and servo processing LSI 32 and the optical disc apparatus 30 that comprises these are also capable of low-power operation. Moreover, by constructing the logic circuits of semiconductor integrated circuits of the optical disc apparatus 30 other than the media-signal processing LSI 31 and error-correction and servo processing LSI 32 according to the present invention, the same effect as described above is obtained.

This kind of information reproduction apparatus is not limited to an optical disc apparatus, and includes, for example, an image recording/playback apparatus having an internal magnetic disc, an information recording/reproduction apparatus that uses a semiconductor memory as memory media, etc. By using this kind of construction, the effect of reducing power consumption is obtained for all kinds of information reproduction apparatuses (including apparatuses having an information recording function) regardless of the type of media on which information is recorded.

FIG. 9 is a pictorial drawing of an image display apparatus that comprises a semiconductor integrated circuit of the invention. A television receiver 40 comprises an image and sound processing LSI 41 that processes image and sound signals, and a display and sound-source control LSI 42 that controls devices such as the display screen and speakers. The image and sound processing LSI 41 and display and sound-source control LSI 42 are semiconductor integrated circuits that have the construction of the present invention. This semiconductor integrated circuit operates with less power consumption than a conventional semiconductor integrated circuit, so the image and sound processing LSI 41, display and sound-source control LSI 42 and the television receiver 40 that comprises these are also capable of low-power operation. Moreover, by constructing the logic circuits of semiconductor integrated circuits of the television receiver 40 other than the image and sound processing LSI 41 and display and sound-source control LSI 42 according to the present invention, the same effect as described above is obtained.

This kind of image display apparatus is not limited to a television receiver, and includes, for example, an apparatus that displays streaming data that is distributed by way of telecommunication lines. By using this kind of construction, the effect of reducing power consumption is obtained for all kinds of image display apparatuses regardless of the type of information transmission method.

Figure 10:
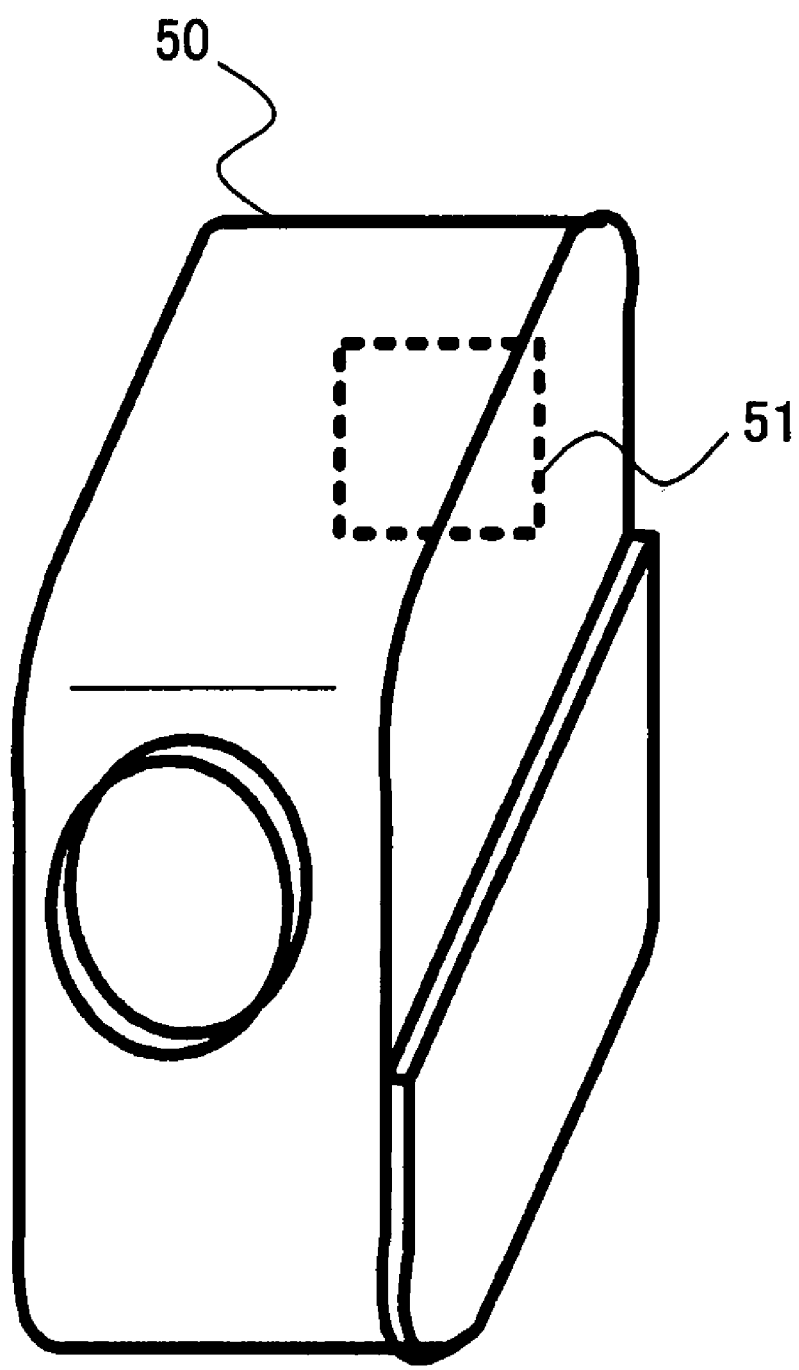
FIG. 10 is a pictorial drawing of an electronic apparatus that comprises a semiconductor integrated circuit of the invention.
Figure 12B:
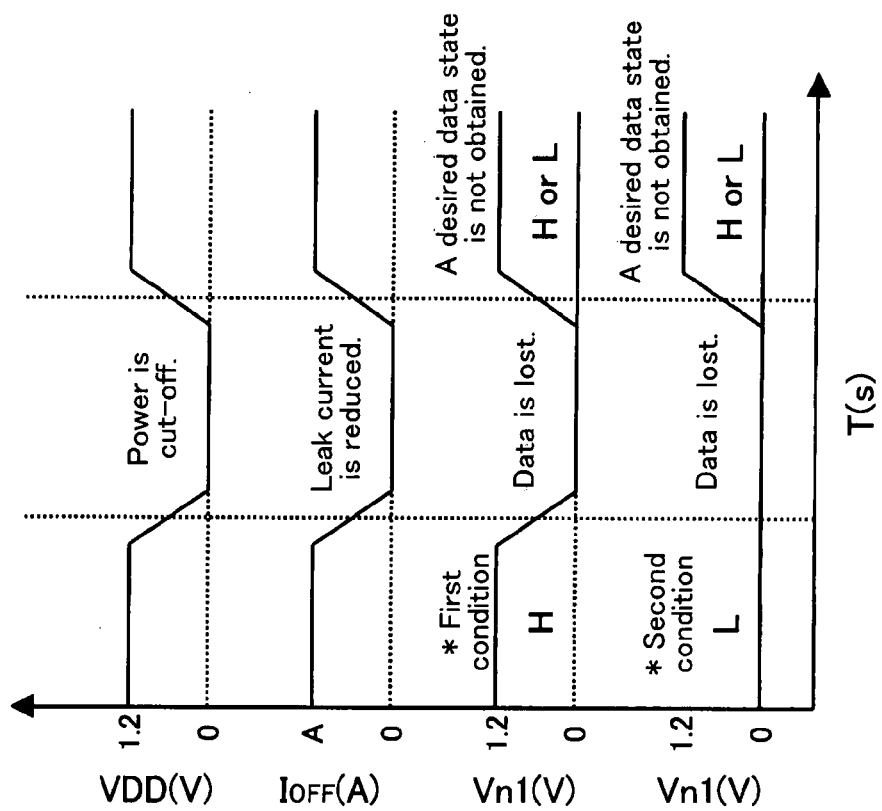
FIG. 12B is a drawing explaining the power cut-off operation of related art.
Figure 12A:
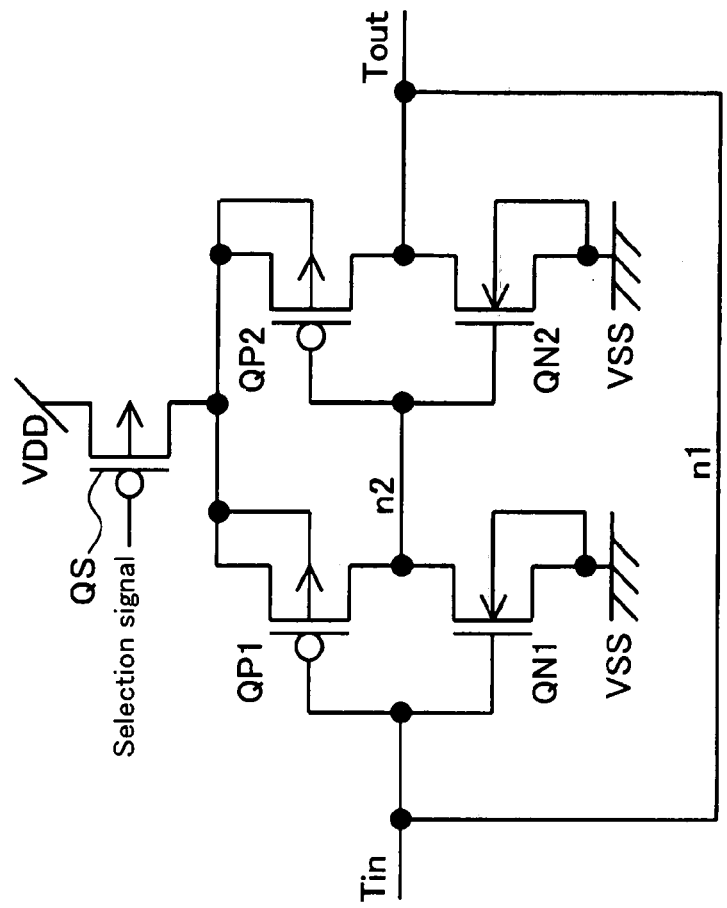
FIG. 12A is a circuit diagram of related art.

FIG. 10 is a pictorial drawing of an electronic apparatus that comprises a semiconductor integrated circuit of the invention. A digital camera 50 comprises a signal processing LSI 51. The signal processing LSI 51 is a semiconductor integrated circuit that has the construction of the present invention. This semiconductor integrated circuit operates with less power consumption than a conventional semiconductor integrated circuit, so the signal processing LSI 51 and the digital camera 50 that comprises it are also capable of low-power operation. Moreover, by constructing the logic circuits of semiconductor integrated circuits of the digital camera 50 other than the signal processing LSI 51 according to the present invention, the same effect as described above is obtained.

This kind of electronic apparatus is not limited to a digital camera, and includes, for example, all kinds of sensors, electronic calculators, and general devices having semiconductor integrated circuits. By using this kind of construction, the effect of reducing power consumption is obtained for all kinds of electronic apparatuses.

FIG. 11 is a pictorial drawing of an electronic control apparatus that comprise a semiconductor integrated circuit of the invention, and an apparatus having a movement function that comprises that electronic control apparatus. An automobile 60 comprises an electronic control apparatus 61. The electronic control apparatus 61 comprises an engine and transmission control LSI 62 that control the engine and transmission of the automobile 60. The engine and transmission control LSI 62 is a semiconductor integrated circuit that has the construction of the present invention. Also, the automobile 60 comprises a navigation apparatus 63. The navigation apparatus 63 comprises a navigation LSI 64. As with the engine and transmission control LSI 62, the navigation LSI 64 is a semiconductor integrated circuit that has the construction of the present invention.

These LSI 62, 64 operate with less power consumption than a conventional semiconductor integrated circuit, so the engine and transmission control LSI 62 and the electronic control apparatus 61 that comprises it, and the navigation LSI 64 and the navigation apparatus 63 that comprises it are also capable of low-power operation. Moreover, by constructing the logic circuits of semiconductor integrated circuits of the electronic control apparatus 61 other than the engine and transmission control LSI 62 according to the present invention, the same effect as described above is obtained. The same can be said of the navigation apparatus 63. Also, by lowering the power consumption of the electronic control apparatus 61, the power consumption of the automobile is also reduced.

This kind of electronic control apparatus is not limited to the aforementioned apparatus that controls an engine and transmission, and includes, for example, all kinds of apparatuses having semiconductor integrated circuits that control power sources. By using this kind of construction, the effect of reducing power consumption is obtained for all kinds electronic control apparatuses.

Also, an apparatus having a movement function mentioned above is not limited to an automobile, and includes, for example, all kinds of apparatuses, such as trains or airplanes having an electronic control apparatus that controls power sources such as engines or transmissions. By using this kind of construction, the effect of reducing power consumption is obtained for apparatuses having a movement function.

The preferred embodiments of the invention were explained in detail, however, the combinations and arrangements of the parts of those preferred embodiments can be changed or altered within the spirit and scope of the invention claimed hereinafter.

What is claimed is:

1. A semiconductor integrated circuit comprising
a latch circuit; wherein:
the latch circuit comprises a first inverter and a second inverter;
the first inverter comprises a first NMOS transistor and a first PMOS transistor;
the second inverter comprises a second NMOS transistor and a second PMOS transistor;
a relationship of current capability of the first NMOS transistor and the first PMOS transistor is constant when a power-supply voltage becomes less than a specified voltage; and
a relationship of current capability of the second PMOS transistor and the second NMOS transistor is constant when the power-supply voltage becomes less than the specified voltage.

2. The semiconductor integrated circuit of claim 1; wherein
the first inverter and the second inverter are both constructed from CMOS transistors;
the current capability of the first NMOS transistor is greater than the current capability of the first PMOS transistor when the power-supply voltage becomes less than the specified voltage; and
the current capability of the second PMOS transistor is greater than the current capability of the second NMOS transistor when the power-supply voltage becomes less than the specified voltage.

3. The semiconductor integrated circuit of claim 1; wherein
the first inverter and the second inverter are both constructed from CMOS transistors;
the current capability of the first PMOS transistor is greater than the current capability of the first NMOS transistor when the power-supply voltage becomes less than the specified voltage; and
the current capability of the second NMOS transistor is greater than the current capability of the second PMOS transistor when the power-supply voltage becomes less than the specified voltage.

4. The semiconductor integrated circuit of claim 1 comprising semiconductor integrated circuitry including the data holding circuit, which intentionally sets the data state of the semiconductor integrated circuitry so that the leak current, when idle, becomes small by setting the power-supply voltage of the semiconductor integrated circuitry to less than the specified voltage.

5. A communication apparatus comprising a baseband LSI and an application LSI, wherein at least one of these LSI is constructed from the semiconductor integrated circuit of claim 1.

6. An information reproduction apparatus comprising a media-signal processing LSI and an error correction and servo processing LSI that performs error correction and servo control, wherein at least one of these LSI is constructed from the semiconductor integrated circuit of claim 1.

7. An image display apparatus comprising an image and sound processing LSI and a display and sound source control LSI, wherein at least one of these LSI is constructed from the semiconductor integrated circuit of claim 1.

8. An electronic apparatus comprising a signal processing LSI, wherein the signal processing LSI is constructed from the semiconductor integrated circuit of claim 1.

9. An electronic control apparatus comprising a control LSI, wherein the control LSI is constructed from the semiconductor integrated circuit of claim 1.

10. The semiconductor integrated circuit of claim 2, wherein
at least one of the first NMOS transistor and first PMOS transistor has a gate width such that when the power-supply voltage becomes less than a specified voltage, the current capability of the first NMOS transistor is greater than the current capability of the first PMOS transistor; and
at least one of the second PMOS transistor and second NMOS transistor has a gate width such that when the power-supply voltage becomes less than the specified voltage, the current capability of the second PMOS transistor is greater than the current capability of the second NMOS transistor.

11. The semiconductor integrated circuit of claim 2, wherein
at least one of the first NMOS transistor and first PMOS transistor has a gate length such that when the power-supply voltage becomes less than a specified voltage, the current capability of the first NMOS transistor is greater than the current capability of the first PMOS transistor; and
at least one of the second PMOS transistor and second NMOS transistor has a gate length such that when the power-supply voltage becomes less than the specified voltage, the current capability of the second PMOS transistor is greater than the current capability of the second NMOS transistor.

12. The semiconductor integrated circuit of claim 2, wherein
at least one of the first NMOS transistor and first PMOS transistor has a gate oxide film thickness such that when the power-supply voltage becomes less than a specified voltage, the current capability of the first NMOS transistor is greater than the current capability of the first PMOS transistor; and
at least one of the second PMOS transistor and second NMOS transistor has a gate oxide film thickness such that when the power-supply voltage becomes less than the specified voltage, the current capability of the second PMOS transistor is greater than the current capability of the second NMOS transistor.

13. The semiconductor integrated circuit of claim 2, wherein
at least one of the first NMOS transistor and first PMOS transistor has a threshold voltage such that when the power-supply voltage becomes less than a specified voltage, the current capability of the first NMOS transistor is greater than the current capability of the first PMOS transistor; and
at least one of the second PMOS transistor and second NMOS transistor has a threshold voltage such that when the power-supply voltage becomes less than the specified voltage, the current capability of the second PMOS transistor is greater than the current capability of the second NMOS transistor.

14. The semiconductor integrated circuit of claim 2 further comprising a current source that supplies a specified current to data holding nodes.

15. The semiconductor integrated circuit of claim 3, wherein
at least one of the first PMOS transistor and first NMOS transistor has a gate width such that when the power-supply voltage becomes less than a specified voltage, the current capability of the first PMOS transistor is greater than the current capability of the first NMOS transistor; and
at least one of the second NMOS transistor and second PMOS transistor has a gate width such that when the power-supply voltage becomes less than the specified voltage, the current capability of the second NMOS transistor is greater than the current capability of the second PMOS transistor.

16. The semiconductor integrated circuit of claim 3, wherein
at least one of the first PMOS transistor and first NMOS transistor has a gate length such that when the power-supply voltage becomes less than a specified voltage, the current capability of the first PMOS transistor is greater than the current capability of the first NMOS transistor; and
at least one of the second NMOS transistor and second PMOS transistor has a gate length such that when the power-supply voltage becomes less than the specified voltage, the current capability of the second NMOS transistor is greater than the current capability of the second PMOS transistor.

17. The semiconductor integrated circuit of claim 3, wherein
at least one of the first PMOS transistor and first NMOS transistor has a gate oxide film thickness such that when the power-supply voltage becomes less than a specified voltage, the current capability of the first PMOS transistor is greater than the current capability of the first NMOS transistor; and
at least one of the second NMOS transistor and second PMOS transistor has a gate oxide film thickness such that when the power-supply voltage becomes less than the specified voltage, the current capability of the second NMOS transistor is greater than the current capability of the second PMOS transistor.

18. The semiconductor integrated circuit of claim 3, wherein
at least one of the first PMOS transistor and first NMOS transistor has a threshold voltage such that when the power-supply voltage becomes less than a specified voltage, the current capability of the first PMOS transistor is greater than the current capability of the first NMOS transistor; and
at least one of the second NMOS transistor and second PMOS transistor has a threshold voltage such that when the power-supply voltage becomes less than the specified voltage, the current capability of the second NMOS transistor is greater than the current capability of the second PMOS transistor.

19. The semiconductor integrated circuit of claim 3 further comprising a current source that supplies a specified current to data holding nodes.

20. The semiconductor integrated circuit of claim 14, wherein the current source is a resistance element.

21. The semiconductor integrated circuit of claim 14, wherein the current source is a MOS transistor.

22. The semiconductor integrated circuit of claim 19, wherein the current source is a resistance element.

23. The semiconductor integrated circuit of claim 19, wherein the current source is a MOS transistor.

24. A movement apparatus comprising the electronic control apparatus of claim 9.

* * * * *